United States Patent
Kim et al.

(10) Patent No.: US 11,227,899 B2
(45) Date of Patent: Jan. 18, 2022

(54) DISPLAY DEVICE

(71) Applicant: Samsung Display Co., Ltd., Yongin-Si (KR)

(72) Inventors: Kyu Seok Kim, Asan-si (KR); Sung Yup Kim, Yongin-si (KR); Soo Young Kim, Seoul (KR); Jong Uk Bang, Gyeongju-si (KR)

(73) Assignee: Samsung Display Co., Ltd.

( * ) Notice: Subject to any disclaimer, the term of this patent is extended or adjusted under 35 U.S.C. 154(b) by 53 days.

(21) Appl. No.: 16/683,171

(22) Filed: Nov. 13, 2019

(65) Prior Publication Data

US 2020/0152706 A1 May 14, 2020

(30) Foreign Application Priority Data

Nov. 14, 2018 (KR) .......................... 10-2018-0139827

(51) Int. Cl.
*H01L 27/32* (2006.01)
*H01L 51/52* (2006.01)

(52) U.S. Cl.
CPC ........ *H01L 27/322* (2013.01); *H01L 51/5253* (2013.01); *H01L 51/5271* (2013.01); *H01L 27/3211* (2013.01); *H01L 27/3244* (2013.01)

(58) Field of Classification Search
CPC ............... H01L 27/3211; H01L 27/322; H01L 51/5253; H01L 51/5271
See application file for complete search history.

(56) References Cited

U.S. PATENT DOCUMENTS

| 2017/0005144 | A1* | 1/2017 | Akagawa | ........... G02B 27/0172 |
| 2019/0333975 | A1* | 10/2019 | Ohchi | ..................... H01L 27/32 |
| 2020/0152706 | A1* | 5/2020 | Kim | ..................... H01L 27/322 |
| 2020/0258944 | A1* | 8/2020 | Joo | ..................... H01L 27/3244 |

(Continued)

FOREIGN PATENT DOCUMENTS

| KR | 10-0529450 B1 | 3/2006 |
| KR | 10-2017-0051764 | 5/2017 |

(Continued)

*Primary Examiner* — George R Fourson, III
(74) *Attorney, Agent, or Firm* — Innovation Counsel LLP

(57) ABSTRACT

A display device is disclosed. The display device may include a first pixel and a second pixel. The first pixel may include a first light emitter and a first color converter overlapping the first light emitter. The second pixel may immediate neighbor the first pixel, may include a second light emitter and a second color converter overlapping the second light emitter. When a distance between the first light emitter and the second light emitter is x and a distance between the first light emitter and the first color converter is y, the following equation is satisfied:

$$y = x \times \tan \theta_1$$

wherein $\theta_1$ is $(90-\theta)$, and the $\theta$ is an included angle between a line perpendicular to a light emitting face of the first light emitter at a point of the light emitting face and a line connecting the point of the light emitting face to any point away from the line perpendicular to the light emitting face, the $\theta$ has a range of an angle corresponding a luminance ratio value in the range of 1% with respect to the light emitted from the first light emitter to an angle corresponding a luminance ratio value in the range of 15% with respect to the light emitted from the first light emitter.

20 Claims, 5 Drawing Sheets

(56) References Cited

U.S. PATENT DOCUMENTS

| | | | |
|---|---|---|---|
| 2020/0273929 A1* | 8/2020 | Kim | H01L 27/3251 |
| 2020/0274089 A1* | 8/2020 | Son | H01L 27/3211 |
| 2020/0312916 A1* | 10/2020 | Kim | H01L 51/5237 |

FOREIGN PATENT DOCUMENTS

| | | |
|---|---|---|
| KR | 10-2018-0028387 A | 3/2018 |
| KR | 10-2018-0044474 A | 5/2018 |

* cited by examiner

| θ | Luminance ratio |
|---|---|
| 0 | 100.0 |
| 15 | 96.6 |
| 30 | 86.6 |
| 45 | 70.7 |
| 60 | 50.0 |
| 75 | 25.9 |
| 80 | 17.4 |
| 81 | 15.6 |
| 82 | 13.9 |
| 83 | 12.2 |
| 84 | 10.5 |
| 85 | 8.7 |
| 86 | 7.0 |
| 87 | 5.2 |
| 88 | 3.5 |
| 89 | 1.7 |
| 90 | 0.0 |

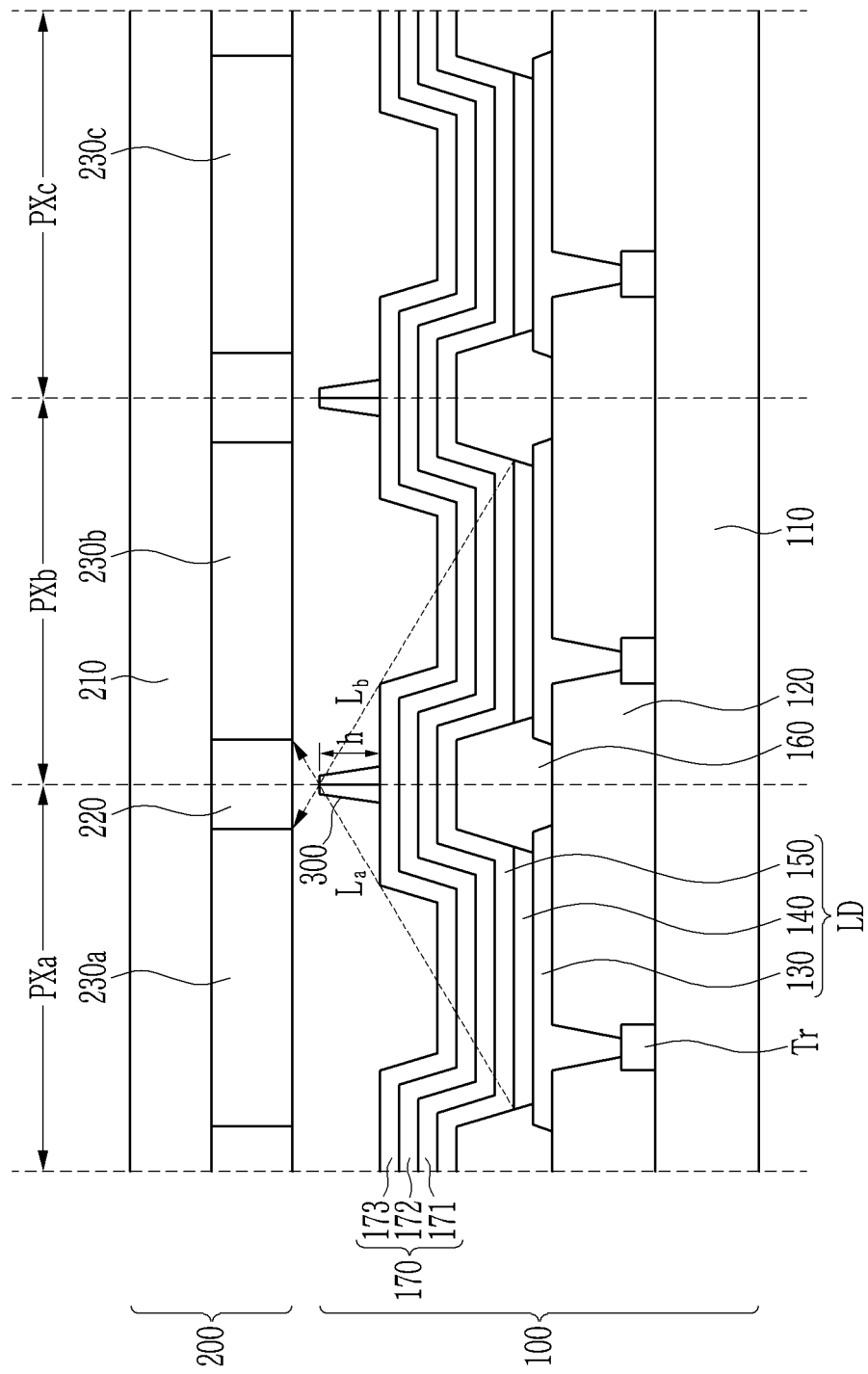

DISPLAY DEVICE

CROSS-REFERENCE TO RELATED APPLICATION

This application claims priority to and the benefit of Korean Patent Application No. 10-2018-0139827 filed in the Korean Intellectual Property Office on Nov. 14, 2018; the entire contents of the Korean Patent Application are incorporated herein by reference.

BACKGROUND

(a) Technical Field

The technical field relates to a display device.

(b) Description of the Related Art

A display device may include a plurality of pixels for displaying an image according to input signals. In the display device, light emitted from a pixel may undesirably affect one or more adjacent pixels.

The above information disclosed in this Background section is for enhancement of understanding of the background of this application. This Background section may contain information that does not form the prior art that is already known in this country to a person of ordinary skill in the art.

SUMMARY

Embodiments may be related to a display device with minimum light interference between adjacent pixels.

An embodiment of present invention provides a display device including a first pixel configured to display a first color, comprising a first light emitter, and comprising a first color converter overlapping the first light emitter; and a second pixel immediate neighboring the first pixel with no intervening pixels between the first pixel and the second pixel, configured to display a second color different from the first color, comprising a second light emitter, and comprising a second color converter overlapping the second light emitter, wherein when a distance between the first light emitter and the second light emitter is x and a distance between the first light emitter and the first color converter is y, the following equation is satisfied:

$$y = x \times \tan \theta_1$$

wherein $\theta_1$ is $(90-\theta)$, and the $\theta$ is included an angle between a line perpendicular to a light emitting face of the first light emitter at a point of the light emitting face and a line connecting the point of the light emitting face to any point away from the line perpendicular to the light emitting face, the $\theta$ has a range of an angle corresponding a luminance ratio value in the range of 1% with respect to the light emitted from the first light emitter to an angle corresponding a luminance ratio value in the range of 15% with respect to the light emitted from the first light emitter.

The $\theta$ may be angle corresponding to a luminance ratio value according to a Lambertian light emitting distribution of the first light emitter, The first light emitter may be configured to emit blue light.

The display device may further comprise a third pixel immediately neighboring the second pixel without any intervening pixels between the second pixel and the third pixel, configured to display a third color different from each of the first color and the second color, comprising a third light emitter, and comprising a transmissive layer overlapping the third light emitter.

The distance between the first light emitter and the first color converter may be equal to a distance between the second light emitter and the second color converter, and the distance between the first light emitter and the first color converter may be equal to a distance between the third light emitter and the transmissive layer.

The first color converter may include a first plurality of quantum dots, and the second color converter may include a second plurality of quantum dots.

The transmissive layer may include a resin that transmits blue light emitted from the third light emitter.

The display device may further include an encapsulation layer disposed between the first light emitter and the first color converter, between the second light emitter and the second color converter, and between the third light emitter and the transmissive layer; a light blocker disposed on the encapsulation layer; a first separator disposed between the first color converter and the second color converter; and a second separator disposed between the second color converter and the transmissive layer.

The first separator may overlap the light blocker.

A height of the light blocker relative to the encapsulation layer may be equal to or greater than a minimum distance from an upper surface of the encapsulation layer to a crossing point of light emitted from a farthest portion of the first light emitter to a nearest portion of the second color converter with respect to the light blocker and light emitted from a farthest portion of the second light emitter to a nearest portion of the first color converter with respect to the light blocker.

Another embodiment provides a display device including a first pixel configured to display a first color, comprising a first light emitter, and comprising a first color converter overlapping the first light emitter; a second pixel immediate neighboring the first pixel with no intervening pixels between the first pixel and the second pixel, configured to display a second color different from the first color, comprising a second light emitter, and comprising a second color converter overlapping the second light emitter; an encapsulation layer disposed between the first light emitter and the first color converter and disposed between the second light emitter and the second color converter; and a light blocker disposed on the encapsulation layer, wherein a height of the light blocker relative to the encapsulation layer is equal to or greater than a minimum distance from the encapsulation layer to a crossing point of light emitted from a farthest portion of the first light emitter to a nearest portion of the second color converter with respect to the light blocker and light emitted from a farthest portion of the second light emitter to a nearest portion of the first color converter with respect to the light blocker.

Embodiments may minimize light interference between adjacent pixels.

BRIEF DESCRIPTION OF THE DRAWINGS

FIG. 5 illustrates a schematic cross-sectional view of a display device according to an embodiment.

DETAILED DESCRIPTION OF EMBODIMENTS

Figure 1:
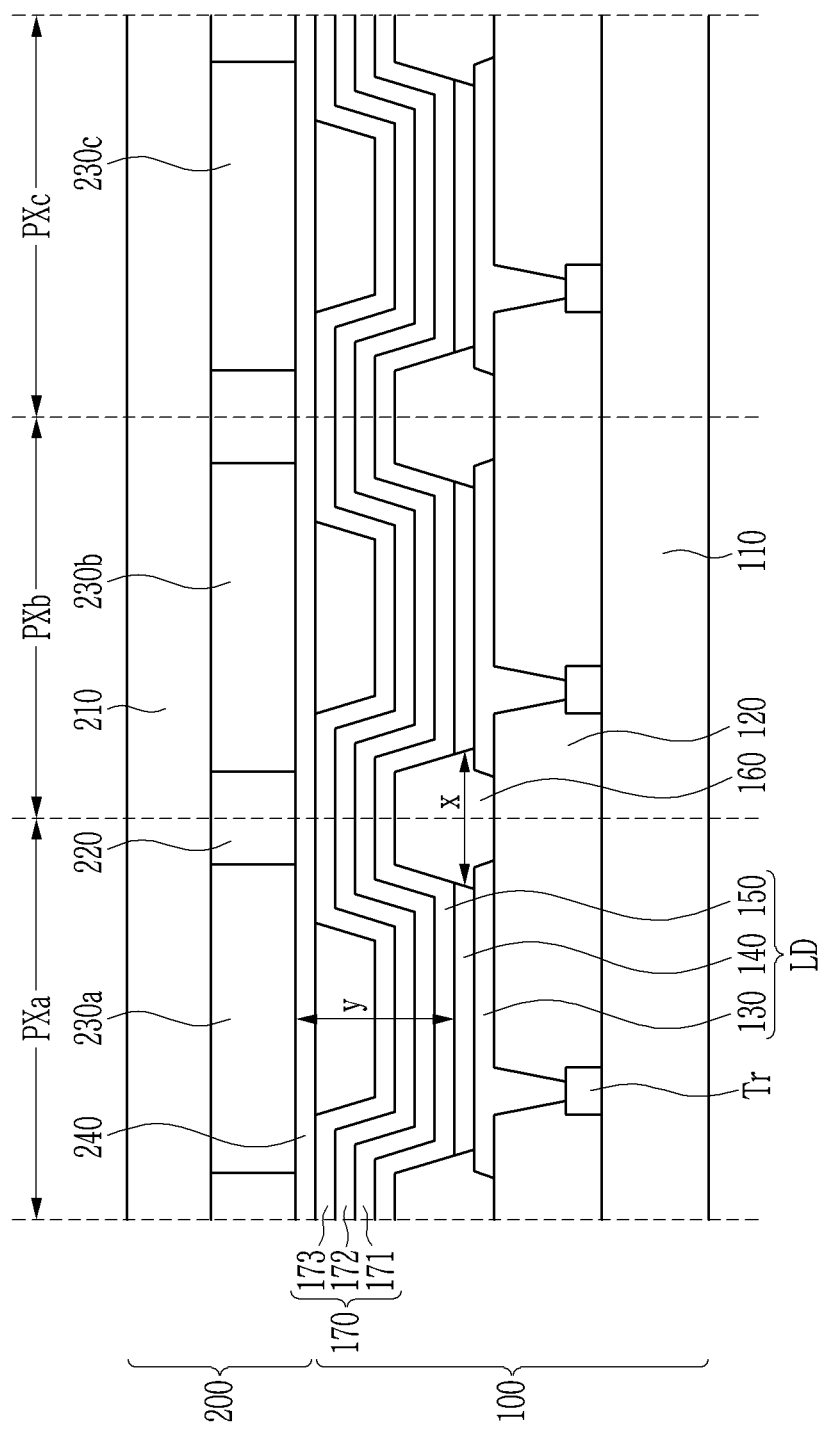
FIG. 1 illustrates a schematic cross-sectional view of a display device according to an embodiment.

Example embodiments are described with reference to the accompanying drawings. As those skilled in the art would realize, the described embodiments may be modified in various ways.

Like reference numerals may designate like elements in the specification.

In the drawings, thicknesses and/or areas of layers, films, panels, regions, etc., may be exaggerated for clarity.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

When a first element is referred to as being "on" a second element, the first element can be directly on the second element, or at least one intervening element may be present between the first element and the second element. When a first element is referred to as being "directly on" a second element, there are no intended intervening elements (except environmental elements such as air) present between the first element and the second element.

Unless explicitly described to the contrary, the word "comprise" and variations such as "comprises" or "comprising" may imply the inclusion of stated elements but not the exclusion of any other elements.

The term "light converting layer" may mean "color converting layer" or "color converter."

FIG. 1 illustrates a schematic cross-sectional view of a display device according to an embodiment.

Referring to FIG. 1, a display device includes a first pixel PXa, a second pixel PXb, and a third pixel PXc. The first pixel PXa, the second pixel PXb, and the third pixel PXc display different colors. For example, the first pixel PXa may display red, the second pixel PXb may display green, and the third pixel PXc may display blue. The first pixel PXa and the second pixel PXb are immediately adjacent to each other, and the second pixel PXb and the third pixel PXc are immediately adjacent to each other. The second pixel PXb is disposed between the first pixel PXa and the third pixel PXc.

The display device includes a first panel 100 and a second panel 200.

The first panel 100 includes a first substrate 110, a transistor Tr (for each pixel), an insulating film 120, a light emitting diode LD (for each pixel), a pixel defining film 160, and an encapsulation layer 170.

The first substrate 110 includes glass or plastic. The transistor Tr is disposed on the first substrate 110, and the insulating film 120 is disposed on the transistor Tr and the first substrate 110. The light emitting diode LD is disposed on the insulating film 120 and connected to the transistor Tr.

The light emitting diode LD includes a first electrode 130 connected to the transistor Tr, a light emitting member 140 disposed on the first electrode 130, and a second electrode 150 disposed on the light emitting member 140. The first electrode 130 may be an anode of the light emitting diode LD, and the second electrode 150 may be a cathode of the light emitting diode LD. The first electrode 130 may include a conductive material that reflects light, and the second electrode 150 may include a transparent conductive material such as an indium tin oxide (ITO), an indium zinc oxide (IZO), or the like. Thus, light emitted from the light emitting member 140 is emitted toward the second electrode 150. The light emitting member 140 may emit blue light.

The pixel defining film 160 is disposed on the insulating film 120 and the first electrode 130 and provided with an opening overlapping the first electrode 130. In the opening of the pixel defining film 160, the light emitting member 140 is disposed on the first electrode 130, and the second electrode 150 is disposed on the light emitting member 140.

The encapsulation layer 170 is disposed on the second electrode 150 and protects the light emitting diode LD. The encapsulation layer 170 includes a first inorganic film 171 disposed on the second electrode 150, an organic film 172 disposed on the first inorganic film 171, and a second inorganic film 173 disposed on the organic film 172.

The first pixel PXa, the second pixel PXb, and the third pixel PXc include the transistor Tr and the light emitting diode LD, respectively.

The second panel 200 is disposed on the encapsulation layer 170.

The second panel 200 includes a second substrate 210, a separating layer 220, a first light converting layer 230a, a second light converting layer 230b, a transmissive layer 230c, and a barrier layer 240. The separating layer 220, the first light converting layer 230a, the second light converting layer 230b, the transmissive layer 230c, and the barrier layer 240 are disposed between the second substrate 210 and the encapsulation layer 170. The barrier layer 240 is disposed on the encapsulation layer 170, and the barrier layer 240 and the encapsulation layer 170 can be adhered by an adhesive layer.

The first pixel PXa may include the first light converting layer 230a, the second pixel PXb may include the second light converting layer 230b, and the third pixel PXc may include the transmissive layer 230c.

The second substrate 210 includes glass or plastic.

The separating layer 220, the first light converting layer 230a, the second light converting layer 230b, and the transmissive layer 230c are disposed on one surface of the second substrate 210, respectively.

The separating layers 220 may be spaced apart from each other at a predetermined interval, and may partition regions in which the first light converting layer 230a, the second light converting layer 230b, and the transmissive layer 230c are disposed. The separating layers 220 overlaps the pixel defining film 160. Each separating layer 220 may be a light blocking member, and may include, for example, a material that absorbs incident light or a material that reflects light. When the separating layer 220 includes the material that reflects light, the separating layer 220 again reflects the light incident on the separating layer 220 from the first light converting layer 230a and the second light converting layer 230b and the transmissive layer 230c to the first light converting layer 230a and the second light converting layer 230b and the transmissive layer 230c, thereby improving light efficiency.

The first light converting layer 230a, the second light converting layer 230b, and the transmissive layer 230c are disposed between the separating layers 220. The first light converting layer 230a, the second light converting layer 230b, and the transmissive layer 230c overlap the three light emitting members 140 of the three pixels, respectively.

The first light converting layer 230a converts the blue light received from the corresponding light emitting diode LD into red light and emits the red light, and the second light converting layer 230b converts the blue light received from the light corresponding emitting diode LD into green light and emits the green light. The transmissive layer 230c emits the blue light received from the corresponding light emitting diode LD as it is. The transmissive layer 230c may be colorless or may be blue.

The first light converting layer 230a and the second light converting layer 230b include a plurality of quantum dots. The quantum dots may be selected from Group II-VI compounds, Group III-V compounds, Group IV-VI compounds, Group IV elements, Group IV compounds, and combinations.

The Group II-VI compound may be selected from a binary compound selected from CdSe, CdTe, ZnS, ZnSe, ZnTe, ZnO, HgS, HgSe, HgTe, MgSe, MgS, and a mixture; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture; and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture.

The Group III-V compound may be selected from a binary compound selected from GaN, GaP, GaAs, GaSb, AlN, AlP, AlAs, AlSb, InN, InP, InAs, InSb, and a mixture; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture; and a quaternary compound selected from GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and a mixture.

The Group IV-VI compound may be selected from a binary compound selected from SnS, SnSe, SnTe, PbS, PbSe, PbTe, and a mixture; a ternary compound selected from SnSeS, SnSeTe, SnSTe, PbSeS, PbSeTe, PbSTe, SnPbS, SnPbSe, SnPbTe, and a mixture; and a quaternary compound selected from SnPbSSe, SnPbSeTe, SnPbSTe, and a mixture.

The Group IV element may be selected from Si, Ge, and a mixture.

The Group IV compound may be a binary compound selected from SiC, SiGe, and a mixture.

In embodiments, the binary compound, the ternary compound, or the quaternary compound may be present in particles at uniform concentrations, or they may be divided into states having partially different concentrations to be present in the same particle, respectively. In addition, a core/shell structure in which some quantum dots enclose some other quantum dots may be possible. An interface between the core and the shell may have a concentration gradient in which a concentration of elements of the shell decreases closer to its center.

The quantum dot may have a full width at half maximum (FWHM) of the light-emitting wavelength spectrum that is equal to or less than about 45 nm, preferably equal to or less than about 40 nm, and more preferably equal to or less than about 30 nm, and in this range, color purity or color reproducibility may be improved.

Since light emitted through the quantum dot is emitted in all directions, a viewing angle of light may be improved. A shape of the quantum dot is not particularly limited to a shape generally used in the art, and may have a spherical, pyramidal, multi-armed, cubic nanoparticle, nanotube, nano-wire, nano-fiber, or nano-plate particle shape.

The transmissive layer 230c includes a resin that transmits blue light.

Each of the first light converting layer 230a, the second light converting layer 230b, and the transmissive layer 230c may further include scatterers. A scatterer may include a material capable of evenly scattering incident light, and for example, may include one of $TiO_2$, $ZrO_2$, $Al_2O_3$, $In_2O_3$, ZnO, $SnO_2$, $Sb_2O_3$, and ITO.

The barrier layer 240 is disposed on one surface of the first light converting layer 230a, the second light converting layer 230b, and the transmissive layer 230c. The barrier layer 240 serves to protect the first light converting layer 230a, the second light converting layer 230b, and the transmissive layer 230c in the manufacturing process of the second display panel 200. The barrier layer 240 may include an inorganic material or an organic material.

In the display device, a distance between a light emitting member and the corresponding light converting layer may be configured based on a distance between the light emitting member and an immediately neighboring light emitting member, for attain desirable color reproducibility. For example, a distance y between the light emitting member 140 of the first pixel PXa and the first light converting layer 230a may be configured based on a distance x between the light emitting member 140 of the first pixel PXa and the light emitting member 140 of the second pixel PXb. The distance y between the light emitting member 140 of the first pixel PXa and the first light converting layer 230a may be equal to that between the light emitting member 140 of the second pixel PXb and the second light converting layer 230b and may be equal to that between the light emitting member 140 of the third pixel PXc and the transmissive layer 230c.

Figure 2:
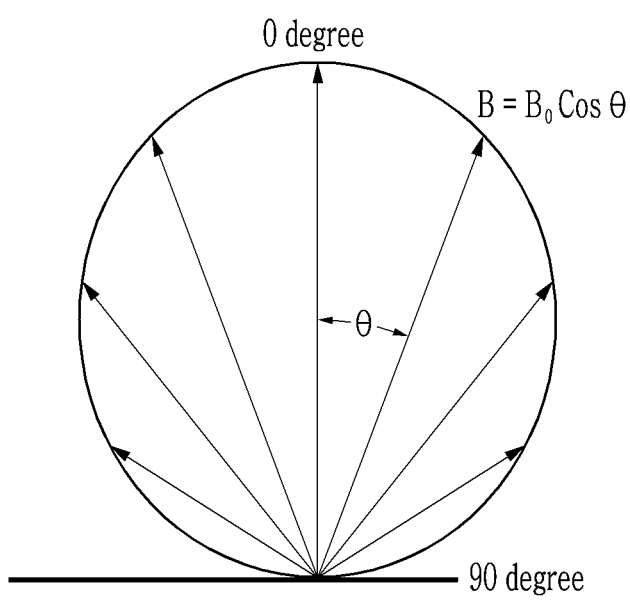
FIG. 2 illustrates a Lambertian light emitting distribution of a light emitting member and luminance ratio values according to the Lambertian light emitting distribution according to an embodiment.
Figure 3:
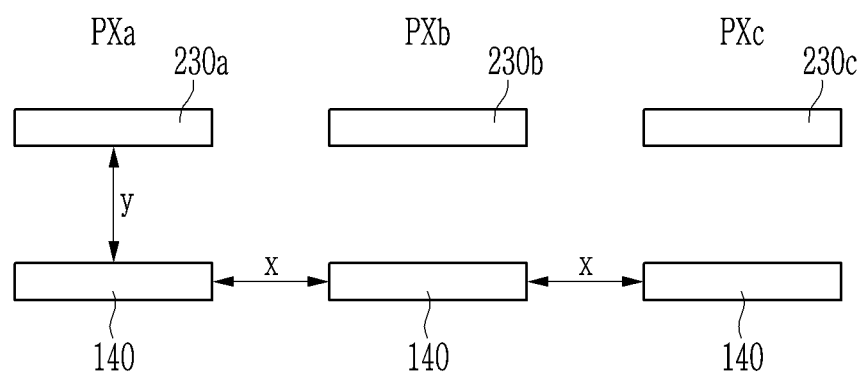
FIG. 3 illustrates a distance between a light emitting member and a light converting layer configured based on a Lambertian light emitting distribution of the light emitting member and luminance ratio values according to an embodiment.

FIG. 2 illustrates a Lambertian light emitting distribution of a light emitting member and luminance ratio values according to a Lambertian light emitting distribution according to an embodiment. FIG. 3 illustrates a distance between a light emitting member and a light converting layer configured based on a Lambertian light emitting distribution of the light emitting member and luminance ratio values according to an embodiment.

When a ratio of a luminance at a neighboring light converting layer to a luminance of the light emitted from the light emitting member is 1% to 15%, light interference between adjacent pixels may be minimized.

Referring to FIG. 2 and FIG. 3, the distance x between the light emitting member 140 of the first pixel PXa and the light emitting member 140 of the second pixel PXb and the distance y between the light emitting member 140 of the first pixel PXa and the first light converting layers 230a satisfy the following equation:

$$y = x \times \tan \theta_1.$$

Here, $\theta_1$ is (90−θ), i.e., a complementary angle to θ. In FIG. 2, the horizontal line tangent to the circle may represent a light emitting face of a light emitting member 140 and θ is an included angle between a line perpendicular to the light emitting face at a point of the light emitting face and a line connecting the point of the light emitting face to any point away from the line perpendicular to the light emitting face.

For attaining desirable color reproductively without significant interference, θ has a range an angle corresponding a luminance ratio value in the range of 1% with respect to the light emitted from the light emitting member 140 to an angle corresponding a luminance ratio value in the range of 15% with respect to the light emitted from the light emitting member 140.

The distance x between the light emitting member 140 of the first pixel PXa and the light emitting member 140 of the second pixel PXb may be designed according to the resolution of the display device. For example, when the distance x between the light emitting member 140 of the first pixel PXa and the light emitting member 140 of the second pixel PXb is 100 μm, and the luminance ratio 10.5% is desirable, since the corresponding θ is 84 degrees, the distance y between the light emitting member 140 of the first pixel PXa and the first light converting layer 230a is configured using the equation y=100×tan(90−84), such that y is about 10.5 μm. As another example, when the luminance ratio 5.2% is desirable, since the corresponding θ is 87 degrees, the distance y between the light emitting member 140 of the first pixel PXa and the first light converting layer 230a is configured using the equation y=100×tan(90−87), such that y is about 5.2 μm.

In embodiments, the distance between the light emitting member and the light converting layer may be configured based on the Lambertian light emitting distribution of the light emitting member and luminance ratio values according to the Lambertian light emitting distribution. Therefore, the light interference between adjacent pixels may be minimized.

Alternative or in addition to the Lambertian light emitting distribution, a Gaussian distribution may be applied. For example, the Gaussian distribution may be applied to obtain the value of $\theta_1$ in the following equation:

$$y = x \times \tan \theta_1.$$

Figure 4:
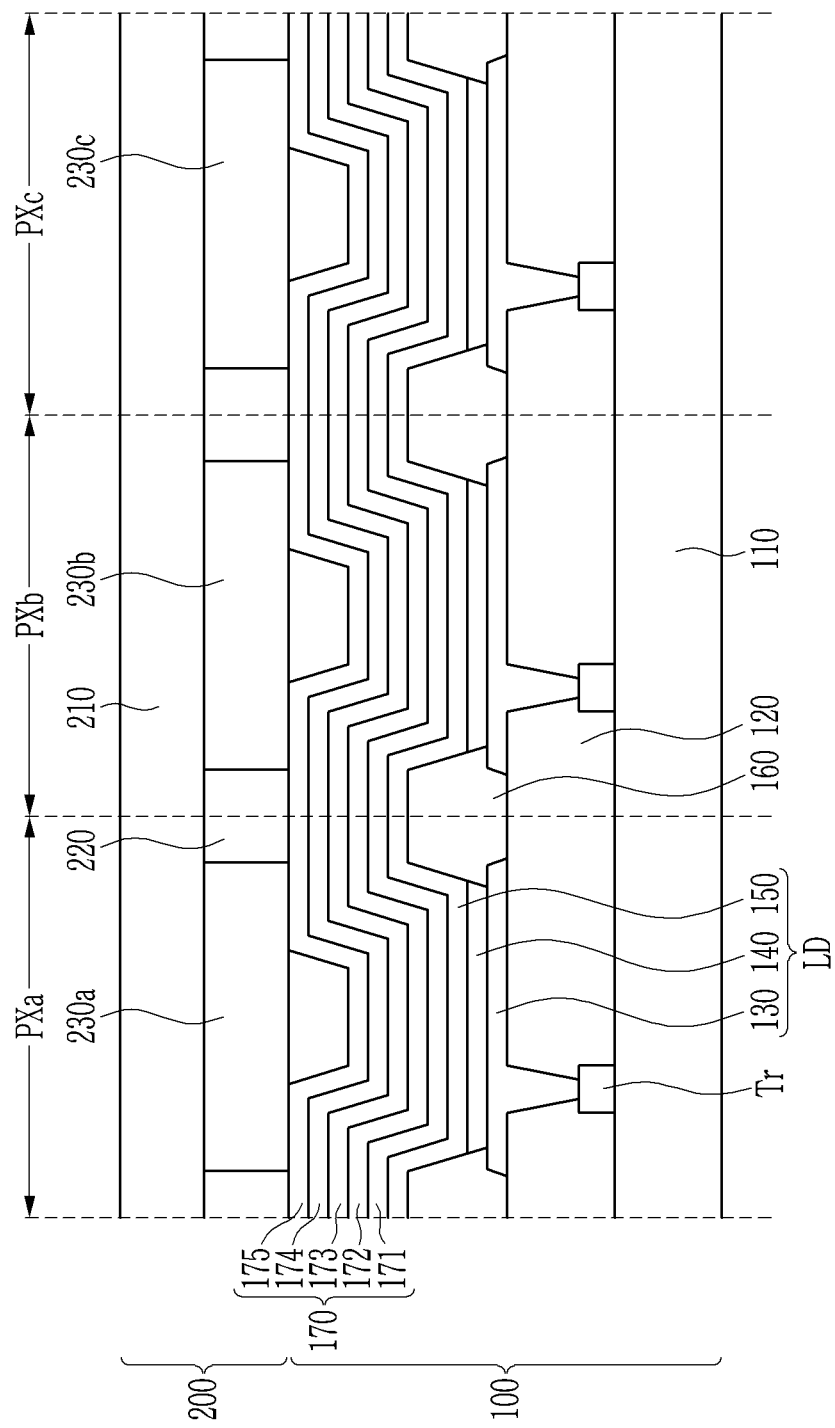
FIG. 4 illustrates a schematic cross-sectional view of a display device according to an embodiment.

FIG. 4 illustrates a schematic cross-sectional view of a display device according to an embodiment.

Referring to FIG. 4, a structure of the encapsulation layer 170 of the display device differs from that of the display device illustrated in FIG. 1, and the remaining structures are the same or similar. Descriptions of the same/similar structures may not be repeated.

The encapsulation layer 170 is disposed on the second electrode 150 and protects the light emitting diode LD. The encapsulation layer 170 includes the first inorganic film 171, the first organic film 172, the second inorganic film 173, a second organic film 174, and a third inorganic film 175.

The first inorganic film 171 is disposed on the second electrode 150, and the first organic film 172 is disposed on the first inorganic film 171. The second inorganic film 173 is disposed on the first organic film 172, the second organic film 174 is disposed on the second inorganic film 173, and the third inorganic film 175 is disposed on the second organic film 174. The distance between the light emitting member and the light converting layer may be configured by configuring the number of inorganic films and organic films included in the encapsulation layer 170. Therefore, the light interference between adjacent pixels may be minimized.

In embodiments, and the encapsulation layer 170 may have a multilayer structure of six or more layers in which an inorganic film and an organic film are repeatedly stacked.

FIG. 5 illustrates a schematic cross-sectional view of a display device according to an embodiment.

Referring to FIG. 5, a structure of one or more light blocking members 300 of the display device differs from that of the display device illustrated in FIG. 1, and the remaining structures are the same or similar. Description of the same/similar structures may not be repeated.

The first panel 100 includes the first substrate 110, the transistor Tr, the insulating film 120, the light emitting diode LD, the pixel defining film 160, the encapsulation layer 170, and a light blocking member 300.

A light blocking member 300 is disposed on the encapsulation layer 170 and overlaps a corresponding separating layer 220. The light blocking member 300 is disposed between the encapsulation layer 170 and the separating layer 220. The light blocking member 300 may include a material that absorbs incident light or a material that reflects light. A light blocking member 300 may be disposed between the first pixel PXa and the second pixel PXb, and a light blocking member 300 may be disposed between the second pixel PXb and the third pixel PXc. When a light blocking member 300 includes a material that reflects light, the light blocking member 300 again reflects the light irradiated to the first light converting layer 230a and the second light converting layer 230b and the transmissive layer 230c of the adjacent pixel in the light emitting member 140 of the corresponding pixel to the first light converting layer 230a and the second light converting layer 230b and the transmissive layer 230c of the corresponding pixel, thereby improving light efficiency. For example, the light blocking member 300 may again reflect the light emitted from the light emitting member 140 of the first pixel PXa to the second light converting layer 230b of the second pixel PXb and the transmissive layer 230c of the third pixel PXc to the first light converting layer 230a of the first pixel PXa.

A height h of the light blocking member 300 relative to the encapsulation layer 170 may be equal to or greater than a minimum distance from an upper surface of the encapsulation layer 170 to a crossing point of light lines emitted from (or geometric lines extending from) farthest portions of two immediately neighboring light emitting members 140 disposed at opposite sides of the light blocking member 300 to nearest portions of immediately neighboring two of the layers 230a, 230b, and 230c disposed at the opposite sides of the light blocking member 300. The light blocking member 300 having the height may prevent the light emitted from the light emitting member 140 of one pixel from being incident on the first light converting layer 230a and the second light converting layer 230b or the transmissive layer 230c of the adjacent pixel.

For example, when the light blocking member 300 is disposed between the first pixel PXa and the second pixel PXb, the height h of the light blocking member 300 relative to the encapsulation layer 170 may be equal to or greater than a distance from the upper surface of the encapsulation layer 170 to a crossing point of a light line La emitted from (or a geometric line extending from) a farthest portion of the light emitting member 140 of the first pixel PXa to a nearest portion of the second light converting layer 230b of the second pixel PXb with respect to the light blocking member 300 and a light line Lb emitted from (or geometric line extending from) a farthest portion of the light emitting member 140 of the second pixel PXb to a nearest portion of the first light converting layer 230a of the first pixel PXa with respect to the light blocking member 300.

While example embodiments have been described, practical embodiments are not limited to the described embodi-

What is claimed is:

1. A display device comprising:
a first pixel configured to display a first color, comprising a first light emitter, and comprising a first color converter overlapping the first light emitter; and
a second pixel immediate neighboring the first pixel with no intervening pixels between the first pixel and the second pixel, configured to display a second color different from the first color, comprising a second light emitter, and comprising a second color converter overlapping the second light emitter, wherein
when a distance between the first light emitter and the second light emitter is x and a distance between the first light emitter and the first color converter is y, the following equation is satisfied:

$$y = x \times \tan \theta_1$$

wherein $\theta_1$ is $(90-\theta)$, and the $\theta$ is an included angle between a line perpendicular to a light emitting face of the first light emitter at a point of the light emitting face and a line connecting the point of the light emitting face to any point away from the line perpendicular to the light emitting face,
the $\theta$ has a range of an angle corresponding a luminance ratio value in the range of 1% with respect to the light emitted from the first light emitter to an angle corresponding a luminance ratio value in the range of 15% with respect to the light emitted from the first light emitter.

2. The display device of claim 1, wherein
the $\theta$ is angle corresponding to a luminance ratio value according to a Lambertian light emitting distribution of the first light emitter.

3. The display device of claim 2, wherein
the first light emitter is configured to emit blue light.

4. The display device of claim 3, further comprising:
a third pixel immediately neighboring the second pixel without any intervening pixels between the second pixel and the third pixel, configured to display a third color different from each of the first color and the second color, comprising a third light emitter, and comprising a transmissive layer overlapping the third light emitter.

5. The display device of claim 4, wherein
the distance between the first light emitter and the first color converter is equal to a distance between the second light emitter and the second color converter, and
the distance between the first light emitter and the first color converter is equal to a distance between the third light emitter and the transmissive layer.

6. The display device of claim 5, wherein
the first color converter includes a first plurality of quantum dots, and
the second color converter includes a second plurality of quantum dots.

7. The display device of claim 6, wherein
the transmissive layer includes a resin that transmits blue light emitted from the third light emitter.

8. The display device of claim 4, further comprising:
an encapsulation layer disposed between the first light emitter and the first color converter, between the second light emitter and the second color converter, and between the third light emitter and the transmissive layer;
a light blocker disposed on the encapsulation layer;
a first separator disposed between the first color converter and the second color converter; and
a second separator disposed between the second color converter and the transmissive layer.

9. The display device of claim 8, wherein
the first separator overlaps the light blocker.

10. The display device of claim 9, wherein
a height of the light blocker relative to the encapsulation layer is equal to or greater than a minimum distance from the encapsulation layer to a crossing point of light emitted from a farthest portion of the first light emitter to a nearest portion of the second color converter with respect to the light blocker and light emitted from a farthest portion of the second light emitter to a nearest portion of the first color converter with respect to the light blocker.

11. A display device comprising:
a first pixel configured to display a first color, comprising a first light emitter, and comprising a first color converter overlapping the first light emitter;
a second pixel immediate neighboring the first pixel with no intervening pixels between the first pixel and the second pixel, configured to display a second color different from the first color, comprising a second light emitter, and comprising a second color converter overlapping the second light emitter;
an encapsulation layer disposed between the first light emitter and the first color converter and disposed between the second light emitter and the second color converter; and
a light blocker disposed on the encapsulation layer, wherein
a height of the light blocker relative to the encapsulation layer is equal to or greater than a minimum distance from the encapsulation layer to a crossing point of light emitted from a farthest portion of the first light emitter to a nearest portion of the second color converter with respect to the light blocker and light emitted from a farthest portion of the second light emitter to a nearest portion of the first color converter with respect to the light blocker.

12. The display device of claim 11, wherein
a distance between the first light emitter and the second light emitter is x and a distance between the first light emitter and the first color converter is y, the following equation is satisfied:

$$y = x \times \tan \theta_1$$

wherein $\theta_1$ is $(90-\theta)$, and the $\theta$ is an included angle between a line perpendicular to a light emitting face of the first light emitter at a point of the light emitting face and a line connecting the point of the light emitting face to any point away from the line perpendicular to the light emitting face,
the $\theta$ has a range of an angle corresponding a luminance ratio value in the range of 1% with respect to the light emitted from the first light emitter to an angle corresponding a luminance ratio value in the range of 15% with respect to the light emitted from the first light emitter.

13. The display device of claim 12, wherein
the $\theta$ is angle corresponding to a luminance ratio value according to a Lambertian light emitting distribution of the first light emitter.

14. The display device of claim 13, wherein
the first light emitter emits blue light.

15. The display device of claim 14, further comprising:
a third pixel immediately neighboring the second pixel without any intervening pixels between the second pixel and the third pixel, configured to display a third color different from each of the first color and the second color, comprising a third light emitter, and comprising a transmissive layer overlapping the third light emitter.

16. The display device of claim 15, wherein
the distance between the light emitter and the first color converter is equal to a distance between the second light emitter and the second color converter, and
the distance between the first light emitter and the first color converter is equal to a distance between the third light emitter and the transmissive layer.

17. The display device of claim 16, wherein
the first color converter includes a first plurality of quantum dots, and
the second color converter includes a second plurality of quantum dots.

18. The display device of claim 17, wherein
the transmissive layer includes a resin that transmits blue light emitted from the third light emitter.

19. The display device of claim 15, further comprising:
a first separator disposed between the first color converter and the second color converter; and
a second separator disposed between the second color converter and the transmissive layer.

20. The display device of claim 19, wherein
the first separator overlaps the light blocker.

* * * * *